United States Patent [19]
Ohwaki et al.

[11] 4,262,165
[45] Apr. 14, 1981

[54] PACKAGING STRUCTURE FOR SEMICONDUCTOR IC CHIP

[75] Inventors: Seishiro Ohwaki, Tokyo; Motoharu Ogawa, Kokubunji, both of Japan

[73] Assignee: Hitachi, Ltd., Japan

[21] Appl. No.: 962,014

[22] Filed: Nov. 20, 1978

Related U.S. Application Data

[62] Division of Ser. No. 776,923, Mar. 11, 1977, Pat. No. 4,157,611.

[30] Foreign Application Priority Data

Mar. 26, 1976 [JP] Japan .................................. 51/32558

[51] Int. Cl.³ ............................................. H05K 5/06
[52] U.S. Cl. .................................. 174/52 FP; 357/74
[58] Field of Search ............... 174/52 FP; 357/74, 72, 357/73; 29/588, 628

[56] References Cited

U.S. PATENT DOCUMENTS

| | | | |
|---|---|---|---|
| 3,059,158 | 10/1962 | Doucette et al. | 29/588 |
| 3,308,525 | 3/1967 | Tsuji et al. | 29/588 |
| 3,684,818 | 8/1972 | Netherwood | 174/52 FP |
| 3,726,006 | 4/1973 | Muckelroy | 174/52 FP X |
| 3,781,976 | 1/1974 | Tomiwa | 29/588 |
| 3,885,860 | 5/1975 | Sorkin | 29/588 |

Primary Examiner—B. A. Reynolds
Assistant Examiner—D. A. Tone
Attorney, Agent, or Firm—Craig and Antonelli

[57] ABSTRACT

A packaging structure for a semiconductor IC chip, in which lead electrodes connected with the chip are extended out through a binding agent filled in a sealing gap, characterized in that in the vicinity of the lead electrodes the outer surface of the binding agent is recessed with respect to the outer surface of the packaging or sealing members.

16 Claims, 9 Drawing Figures

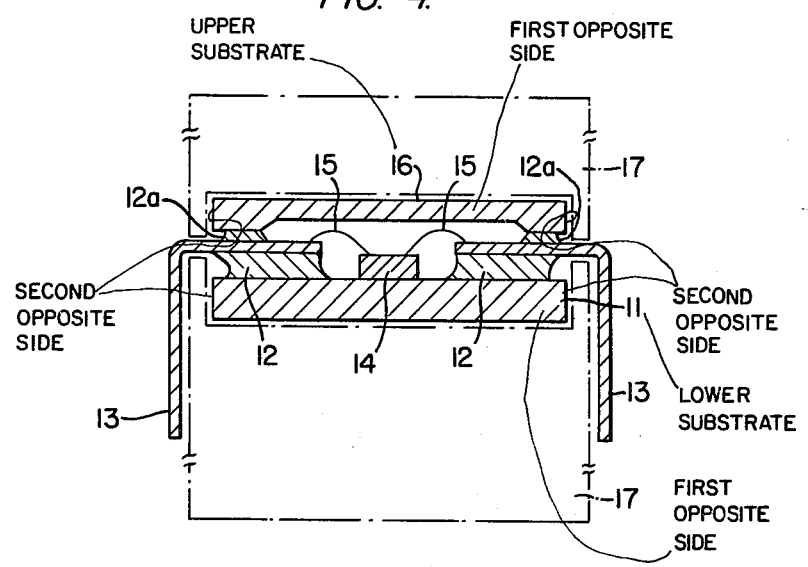
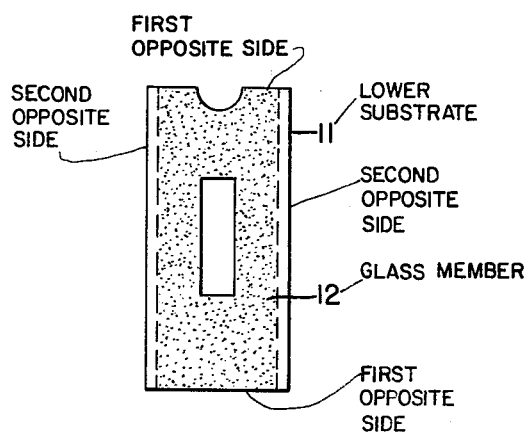
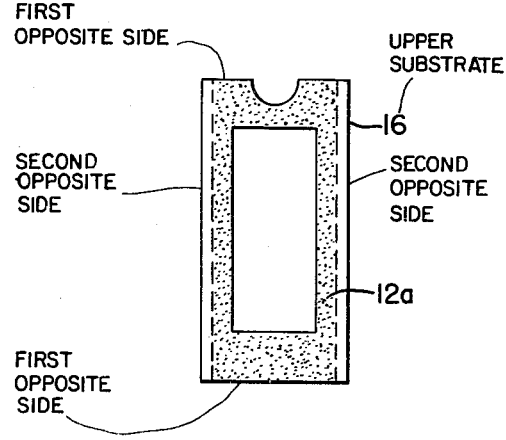

PACKAGING STRUCTURE FOR SEMICONDUCTOR IC CHIP

This is a Division of application Ser. No. 776,923 filed Mar. 11, 1977, now U.S. Pat. No. 4,157,611.

This invention relates to a packaging structure for a semiconductor IC chip and a method of packaging a semiconductor IC chip.

A variety of packaging structures have been put into practice for the purpose of sealing IC chips. Of those structures, the dual inline type glass-sealed structure (hereinafter written for brevity as DIL-G structure) is very widely used since it is inexpensive, reliable and simple in configuration in comparison with the other sealing structures.

The DIL-G structure is as shown in cross section in FIG. 1 and assembled as follows. A ceramic base 1 is heated to soften the layer of glass 2 having a low melting point and applied on the base 1. To the ceramic base 1 are adhered discrete bracket-shaped lead frames 3 and an IC chip 4. The bonding pad electrodes of the IC chip 4 are connected with the corresponding lead electrodes of the lead frames 3 by fine metal wire 5. The thus assembled structure is capped with a ceramic cap 6 and sealed with glass 2a of low melting point.

Since the DIL-G structure uses the discrete bracket-shaped lead frames 3, special jigs for supporting the lead frames 3 in such specific shape are needed and therefore the assembling process is complicated and also requires many steps.

In order to reduce the production cost of an IC through the decrease in labor and through automatization in the assembly process of such a DIL-G structure, a DIL-G structure has been proposed which uses a lead frame 3a as shown in FIG. 2 consisting of plural flat leads coupled together, instead of discrete bracket-shaped lead frames 3 as shown in FIG. 1. However, this DIL-G structure shown in FIG. 2 has a drawback as follows. After the sealing step, the leads of the lead frame 3a are to be bent according to the predetermined specification. During the bending step, it sometimes happens that gaps are formed between the leads and the low melting point glass 2, 2a as sealing agent or that cracks are formed in the glass 2, 2a, as shown in FIG. 3. Accordingly, the sealing property is degraded in the sealing glass layer so that the reliability becomes degraded.

It is therefore an object of this invention to provide packaging structures for semiconductor IC chips which have a high reliability, are free from the above mentioned drawback and are adapted for automatic sealing. It is another object of this invention to provide a method of packaging the above structure.

According to this invention, which has been made to attain the above object, thee is provided a packaging structure for a semiconductor IC chip in which lead electrodes connected with the semiconductor IC chip are extended out through the binding agent filled in a sealing gap, characterized in that in the vicinity of the lead electrodes the outer surface of the binding agent is recessed with respect to the outer surface of the packaging or sealing members.

The other objects and advantages will be clarified when the following description of this invention is read in connection with the attached drawings, in which:

FIG. 4 shows in cross section semiconductor IC according to this invention;

FIGS. 5 and 7 are plans of ceramic bases used as a part of a package according to this invention;

FIGS. 6 and 8 are bottom views of ceramic caps used as a part of a package according to this invention.

Figure 1:
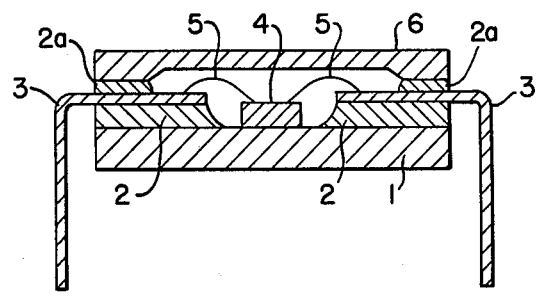
FIGS. 1 to 3 show in cross section conventional electronic devices.
Figure 2:
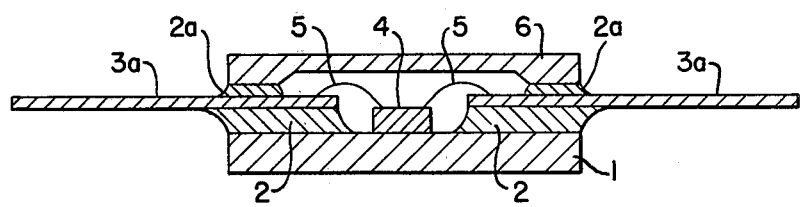
Figure 3:
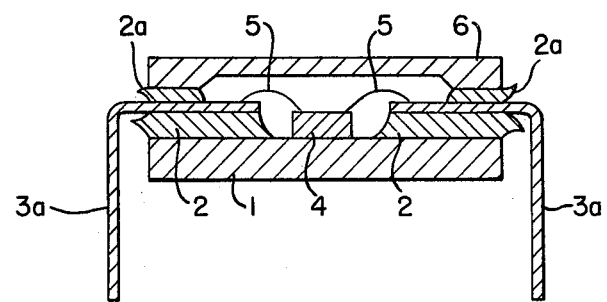

This invention will now be described concretely by way of embodiments with the aid of the attached drawings. In FIG. 4, reference numerals 11 indicate ceramic bases; 12, 12a glass of low melting point; 13 a lead frame; 14 a semiconductor IC chip; 15 bonding wire, e.g. fine metal wire; 16 a ceramic cap; and 17 jigs for supporting the semiconductor IC when the leads of the lead frame 13 are bent.

Figure 7:
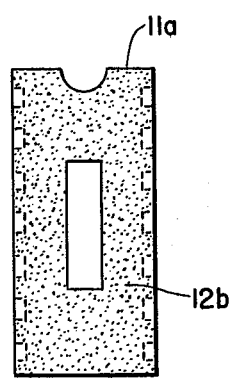
Figure 8:
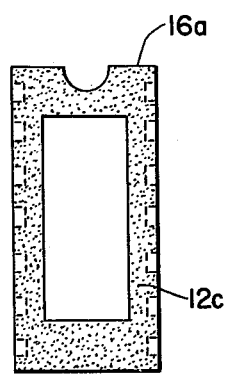

The method of mounting the semiconductor IC according to this invention will be described below. On the confronting surfaces of the ceramic base 11 and the ceramic cap 16 of the package is applied a mixture solution of glass consisting of glass powder, solvent such as aluminum acetate and binder such as cellulose, the glass mixture having a low melting point and a predetermined viscosity and being applied to a thickness of 0.2-0.3 mm. After sintering treatment, a ceramic base 11 and a ceramic cap 16 having respectively the layers of low melting point glass 12 and 12a are prepared as shown in FIGS. 5 and 6. In this case, the glass layers 12 and 12a are not made respectively on the parts of the ceramic base 11 and the ceramic cap 16 recessed by less than about 0.1 mm from the respective both ends from which the leads of the lead frame 13 are derived. This configuration is essential for the reason that the ends of the glass layers 12 and 12a should not extend beyond the edges of the ceramic base 11 and cap 16 when the base 11, the cap 16 and the lead frame 13 are bound by the low temperature melting glass 12 and 12a. Therefore, numerous variations or modifications may be adoptable without departing from the scope of this invention if only the essential requirement, i.e. the provision of the narrower glass layer, is taken into consideration. For example, it is possible not to apply the glass 12 and 12a to those portions of the ceramic base 11a and cap 16a where the lead frame 13 is to be located, as shown in FIGS. 7 and 8.

The ceramic base 11 having the low temperature melting glass layer 12 of the above-mentioned shape is subjected to heat treatment and the lead frame 13 and the semiconductor IC chip 14 are fastened to the ceramic base 11 through the softening of the glass layer 12 due to heat. The bonding pads of the semiconductor chip 14 are connected respectively with the corresponding lead electrodes of the lead frame 13 by fine metal wires 15 such as aluminum wire. The ceramic cap 16 is fastened for sealing to the above prepared structure by means of the low temperature melting glass 12a.

As seen in FIG. 4, the semiconductor IC sealed within the ceramic base 11 and ceramic cap 16 is supported by the jigs 17 and the flat lead electrodes are bent. The unwanted portions of the lead frame 13 are removed by cutting so that a semiconductor IC is completed.

As described above, according to the semiconductor IC embodying this invention, the ends of the glass layers 12 and 12a do not extend beyond the edges of the ceramic base 11 and the ceramic cap 16 so that the jigs 17 can be set without touching the glass layers 12 and 12a, no matter what shapes the glass layers may have, when the leads are bent. Therefore, no harmful external force is exerted on the exposed portions of the glass layers 12 and 12a so that cracks and/or gaps are not formed in the portions and that the glass layers 12 and 12a are prevented from being broken. Accordingly, the hermetic sealing is not degraded and therefore a semiconductor IC having a high reliability can be obtained.

Figure 9:
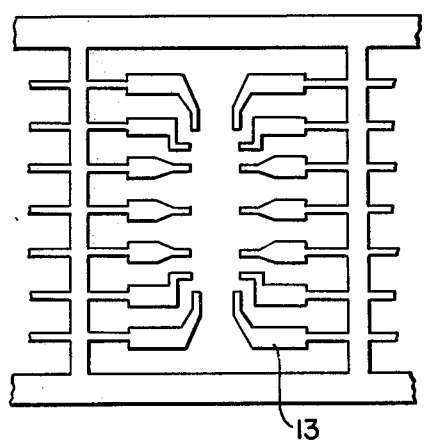
FIG. 9 is a plan of a lead frame according to this invention.

Moreover, since the semiconductor IC according to this invention can use a flat lead frame 13 consisting of plural lead electrodes coupled together as shown in FIG. 9, the mounting process can be completely automatized, resulting in the reduction in labor and production cost.

This invention is by no means limited to the embodiments described above and shown in the attached drawings, but permits of other applications to various electronic devices.

What we claim is:

1. A packaging structure for a semiconductor chip, comprising,
    (a) a semiconductor chip;
    (b) lead members connected with said semiconductor chip;
    (c) first and second ceramic members for sealing said semiconductor chip and said lead members therein; and
    (d) a glass member through which said lead members extend out of said first and second ceramic members, wherein said glass member in the vicinity of said lead members is recessed from the outer edges of said first and second ceramic members.

2. A packaging structure as claimed in claim 1, wherein said lead members consist of plural leads formed integrally.

3. A packaging structure as claimed in claim 1, wherein said glass member has a low melting point.

4. A packaging structure as claimed in claim 1, wherein the glass member is recessed from the outer edge of each said first and second ceramic members at least in the portions of said ceramic members where said lead members are to be located.

5. A packaging structure for an electronic element comprising,
    (a) upper and lower ceramic substrates, at least one of said upper and lower ceramic substrate having an electronic element mounted thereon;
    (b) a glass member applied on opposing peripheral surfaces of said ceramic substrates but spaced from at least portions of outer edges of said upper and lower ceramic substrates, said electronic element being sealed by said glass member and said ceramic substrates; and
    (c) lead members embedded in said glass member and extending from said electronic element toward said outer edges, said lead members being electrically connected with said electronic element.

6. A packaging structure according to claim 5, wherein an outer wall of said glass member from which at least one of said lead members protrudes and extends toward the outer edges of said upper and lower sealing substrates has a projecting portion in the vicinity of the protruding part of said one of the lead members.

7. A packaging structure according to claim 5, wherein said glass member has a low melting point.

8. A packaging structure according to claim 5, wherein said lead members bend in the direction of said lower substrate.

9. A packaging structure according to claim 5, wherein said glass member is spaced at a predetermined distance from at least portions of outer edges of said upper and lower sealing substrates.

10. A packaging structure according to claim 5, wherein said electronic element consists of a semiconductor chip.

11. A packaging structure for an electronic element comprising,
    (a) upper and lower sealing substrates, at least one of said upper and lower sealing substrates having an electronic element mounted thereon;
    (b) a glass member applied on opposing peripheral surfaces of said sealing substrates but spaced from only portions of edges, across which the lead members extend, of said upper and lower sealing substrates; and
    (c) lead members embedded in said glass member and extending from said electronic element toward said edges, said lead members being electrically connected with said electronic element.

12. A packaging structure for a semiconductor chip, comprising,
    (a) a semiconductor chip;
    (b) lead members connected with said semiconductor chip;
    (c) first and second ceramic members for sealing said semiconductor chip and said lead members therein; and
    (d) a glass member through which said lead members extend out of said first and second ceramic members in parallel with said first and second ceramic members, wherein said glass member in the vicinity of said lead members is recessed from the edges of said first and second ceramic members and said lead members are bent outside said edges in the direction transverse with respect to said first ceramic member.

13. A packaging structure for an electronic element comprising,
    (a) upper and lower ceramic substrates, at least one of said upper and lower ceramic substrates having an electronic element mounted thereon;
    (b) a glass member applied on opposing peripheral surfaces of said ceramic substrates but spaced from at least portions of edges of said upper and lower ceramic substrates, said electronic element being sealed by said glass member and said ceramic substrates; and
    (c) lead members embedded in said glass member and extending from said electronic element toward the outside of said edges in parallel with upper and lower ceramic substrates, said lead members being electrically connected with said electronic element, and said lead members being bent in the direction transverse with respect to said upper and lower ceramic substrates.

14. A packaging structure for an electronic element comprising,
    (a) upper and lower sealing substrates being opposed to each other, said upper and lower sealing substrates each having first opposite sides and second opposite sides perpendicular to said first opposite sides, at least one of said upper and lower sealing substrates having an electronic element mounted thereon;
    (b) a glass member applied on opposing peripheral surfaces of said sealing substrates, said glass member reaching an edge of each of said first opposite sides of the sealing substrates, but being recessed from the edges of said second opposite sides, said electronic element being sealed by said glass member and said sealing substrates; and (c) lead members extending in parallel with said sealing substrates from the portions of said glass member, which are located on said sealing substrates recessed from said second opposite sides, to the outside of said second opposite sides, and being bent at the outside of said second opposite sides in the direction transverse with respect to said sealing substrates.

15. A packaging structure according to claim 1 or 12, wherein the said first and second ceramic members have thermal coefficients of expansion of substantially the same magnitude.

16. A packaging structure according to claim 5, 13, or 14, wherein the said upper and lower substrates have thermal coefficients of expansion of substantially the same magnitude.

* * * * *